United States Patent [19]
Newell et al.

[11] 4,044,317
[45] Aug. 23, 1977

[54] CRYSTAL CONTROLLED SQUARE WAVE OSCILLATOR

[75] Inventors: Darrell E. Newell, Yorkville; John F. Jennings, Chicago; Steven Lyle Fritsch, Earlville; Howard D. Hinnah, Sandwich, all of Ill.

[73] Assignee: CTS Corporation, Elkhart, Ind.

[21] Appl. No.: 733,210

[22] Filed: Oct. 18, 1976

[51] Int. Cl.² ............................................. H03B 5/36
[52] U.S. Cl. ................... 331/116 R; 310/361; 310/366; 310/369; 331/59; 331/163
[58] Field of Search ........... 331/108 C, 108 D, 116 R, 331/163, 59; 310/8.1, 9.8; 58/23 AC

[56] References Cited

U.S. PATENT DOCUMENTS

| 3,815,129 | 6/1974 | Sweany | 310/9.8 |
| 3,911,378 | 10/1975 | Buchanan | 331/108 C |
| 3,916,345 | 10/1975 | Eberlein et al. | 331/108 D |

FOREIGN PATENT DOCUMENTS

| 44-26349 | 2/1966 | Japan | 331/116 R |

Primary Examiner—John Kominski
Attorney, Agent, or Firm—Leydig, Voit, Osann, Mayer & Holt, Ltd.

[57] ABSTRACT

A crystal controlled square wave oscillator requiring a minimum number of components, exhibiting high frequency stability, and operating at substantially a 50% duty cycle. A quartz crystal dual monolithic resonator is provided having a pair of signal electrodes and a reference electrode. The resonator is capable of oscillating in symmetric and anti-symmetric modes, points of minimum attenuation, the symmetric mode exhibiting a 180° phase shift, and the anti-symmetric mode exhibiting a phase shift of 0°. An integrated circuit logic gate is connected between the signal electrodes, the logic gate being of the type having low input and output impedances so as not to degrade the Q of the resonator. The logic gate provides a phase shift of 180° or 0° causing the resonator to oscillate in its symmetric or anti-symmetric modes, respectively, the gate switching between its two logic levels to produce a square wave output at the frequency of the excited mode.

14 Claims, 9 Drawing Figures

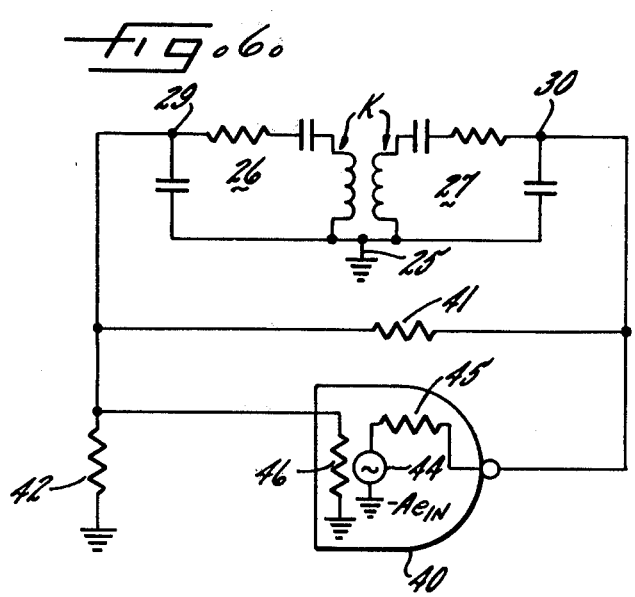
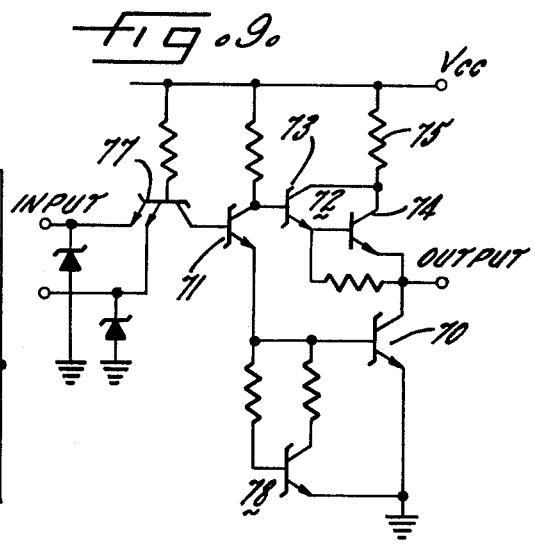
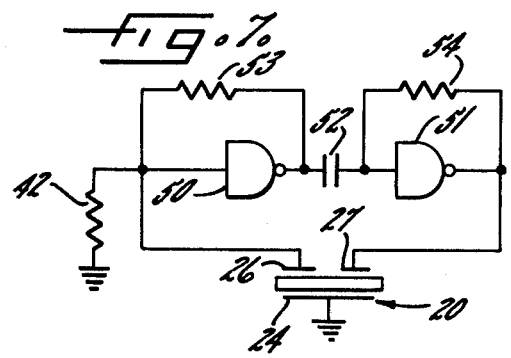
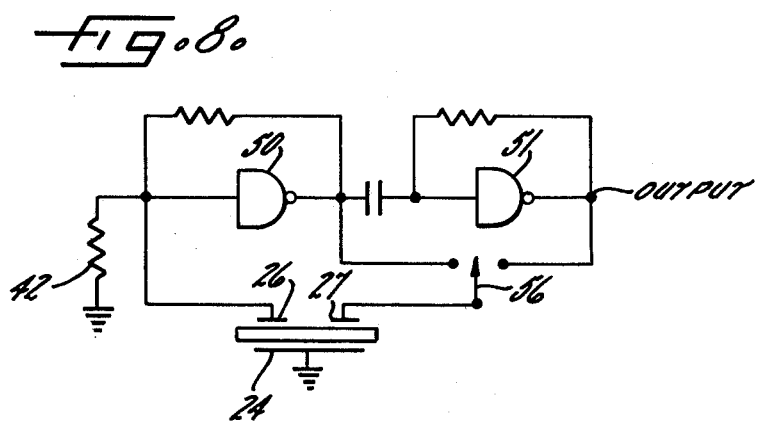

CRYSTAL CONTROLLED SQUARE WAVE OSCILLATOR

This invention relates to crystal controlled oscillators, and more particularly to those operating at logic levels and adapted to produce a square wave output.

Digital logic circuits often require a stable master clock signal, for example, as the master time base against which the system sub-elements are coordinated. Typical requirements for such a clock oscillator are that it operate at logic levels, produce a square wave of approximately 50% duty cycle with sharp leading and trailing edges, have a stable operating frequency and occupy a minimum of board space. Numerous types of oscillators and multivibrators have been proposed and utilized, but have been only partly successful in meeting these and other specialized requirements.

For example, integrated circuit multivibrators are available, using external resistors and capacitors, and are compatible with most forms of logic circuitry. Such circuits are often used where the exact clock frequency is not critical. In cases where the frequency must be controlled with some degree of precision, crystal controlled oscillators are generally employed. To meet this need, circuits comprising various combinations of crystals, logic gates and other passive elements have been devised. Typically, a common two terminal crystal resonator is connected as one of the elements of a feedback path around one or more logic gates arranged to satisfy the criteria for sustained oscillation.

An oscillator configuration comprising two inverting logic gates serially connected and having a feedback path including a serially connected capacitor and crystal serves to illustrate certain of the problems with prior art crystal controlled logic gate resonators. In such a circuit, if the gates make a rather rapid state transition when power is first applied to the circuit, sufficient spectral energy will pass through the feedback path to cause a further change of state so that oscillation will build to the steady state. However, if there is insufficient spectral energy in the frequency band near the resonant frequency, the oscillator will simply not start.

In addition to the marginal starting ability, if high speed logic gates, such as Schottky clamped gates, are used, the circuit may break into oscillation at a harmonic of the fundamental resonant frequency. More specifically, the crystal has a variety of pass bands, and if the gates are capable of operating at such frequencies, and sufficient spectral energy is present in those bands at start-up, the circuit may oscillate at a harmonic.

In such a circuit, the crystal provides an inductive reactance in the feedback path, with the magnitude of the inductive reactance determining the frequency of oscillation. If the propagation delay through the gates is not insignificant, an apparent phase shift will be introduced into the loop, altering the operating frequency. Thus, the frequency stability of the oscillator is very dependent on propagation delay.

Another form of known crystal controlled oscillator uses a single inverting logic gate and a pi network in the feedback path thereof, the pi network including a pair of capacitors forming the legs and a common two terminal crystal in the bridge. If the gate exhibits a relatively low output impedance, a resistor may be connected in series therewith, such resistor having a value to adjust the phase-frequency characteristic of the circuit so that the rate of change of phase with respect to frequency is relatively high at the intended operating frequency, yielding reasonable frequency stability. However, the series resistor introduces losses into the loop, and thus limits the starting ability.

To enhance starting ability, a further pair of resistors may be added, one connected between the input and the output of the gate and the other from the input of the gate to circuit common. These resistors tend to bias the gate into its linear region, so that the gate is oscillatory on start-up, whereby a small signal within the bandwidth of the pi network can be amplified successively as it flows around the path, ultimately causing the gate to reach switching thresholds. The starting resistor connected between the gate input and output is connected directly across the crystal and, thus has an appreciable de-Qing effect, thus tending to reduce the frequency stability. As in the previous circuit, propagation delays have a detrimental effect on frequency stability.

With the foregoing in mind, it is an object of the present invention to provide a crystal controlled square wave oscillator of improved configuration for driving logic circuitry. capable of reliable start-up and possessing enhanced frequency stability. It is a further object to provide such a crystal controlled oscillator constructed with a minimum number of components.

A general objective of the present invention is to provide a crystal controlled oscillator requiring no precision reactive components, and thus being of inexpensive construction. In that regard, an object of the present invention is to provide such a crystal controlled oscillator which may be fabricated in hybrid form in a single miniaturized package.

According to another aspect of the invention, an object is to provide a square wave clock oscillator using a single quartz crystal but capable of operation at two distinct crystal controlled frequencies.

Other objects and advantages will become apparent from the following detailed description when taken in conjunction with the drawings, in which:

FIG. 6 is a diagram illustrating an approximate equivalent circuit of the oscillator of FIG. 5;

FIG. 7 is a schematic diagram of anti-symmetric mode oscillator according to the present invention;

FIG. 8 is a schematic diagram of a dual frequency oscillator; and

FIG. 9 is a schematic diagram of a preferred logic gate for use in the present invention.

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
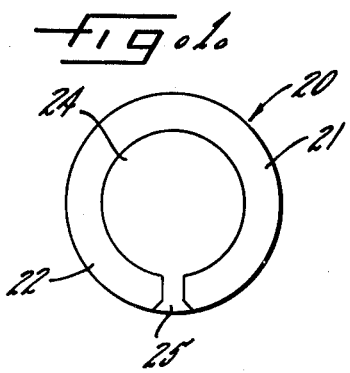
FIGS. 1 and 2 are top and bottom views, respectively, of one form of monolithic dual resonator useable in a crystal controlled oscillator according to the present invention.
Figure 2:
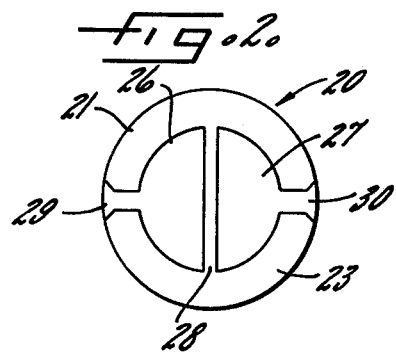

Turning now to the drawings, FIGS. 1 and 2 show a monolithic dual resonator 20 useable as the frequency establishing element in a crystal controlled oscillator according to the present invention. A circular quartz crystal blank 21, preferably an AT cut, has a pair of opposed major faces, upper face 22 being illustrated in FIG. 1 and lower face 23 being illustrated in FIG. 2. Plated upon the upper face 22 is a circular electrode 24 having a terminal portion 25. On the opposed major face 23 are a pair of electrodes 26, 27 separated by a gap 28 and cooperating with the circular electrode 24. The electrodes 26, 27 have terminal portions 29, 30, respectively. Those skilled in the art will recognize monolithic resonator 20 as a typical thickness shear resonator, used, for example, in filter applications. It should also be noted that the circular crystal blank and electrodes are merely illustrative of the numerous shapes for these elements which may be used in practicing the present invention.

Figure 3:
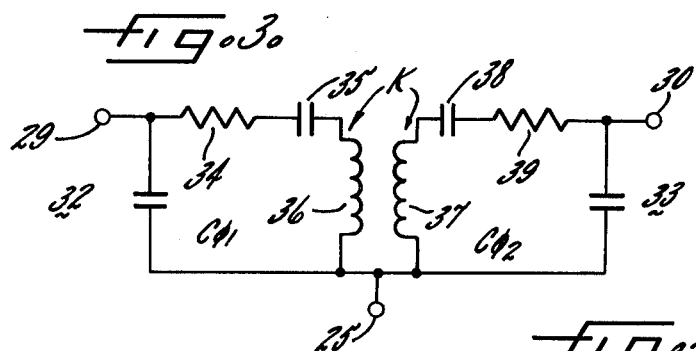
FIG. 3 is a diagram showing an electrical equivalent circuit of the resonator of FIGS. 1 and 2.

Referring to FIG. 3, there is shown an electrical equivalent circuit of the dual monolithic resonator of FIGS. 1 and 2. It is seen that the crystal has an input circuit 32 taken between terminal 29 of the split electrode 26 and terminal 25 of the reference electrode, and an output circuit 33 taken between terminal 30 of the split electrode 27 and terminal 25 of the reference electrode. It will be appreciated that the electrodes may be arbitrarily designated as input and output, the particular designation above merely being exemplary.

An equivalent circuit of the monolithic resonator 20 is shown as a pair of R-L-C series circuits with resistor 34, capacitor 35 and inductor 36 in the input circuit 32, and inductor 37, capacitor 38 and resistor 39 in the output circuit 33. Signal is passed between the circuits by virtue of the coupling between inductors 36, 37, illustrated in the drawing as $k$. In effect, the device acts as an acoustic transformer having series resonant input and output circuits.

Figure 4:
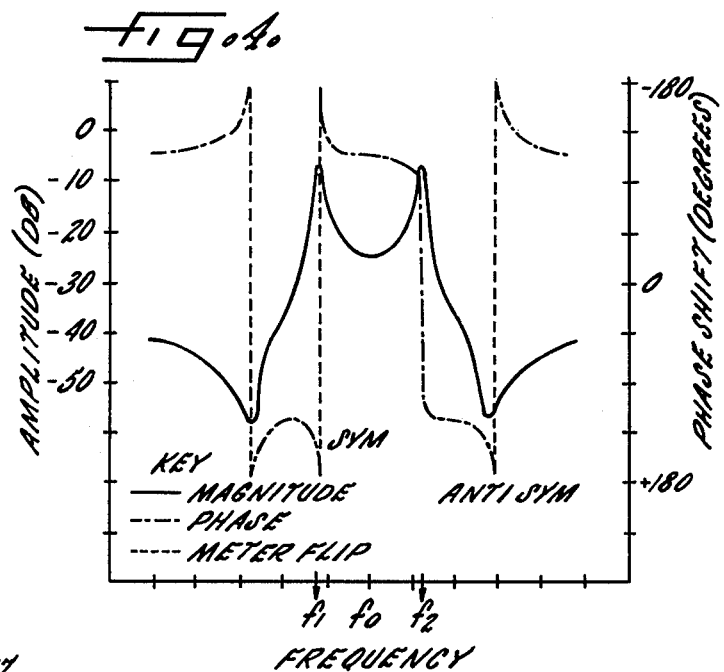
FIG. 4 is a graph illustrating the amplitude and phase versus frequency characteristics of the dual resonator of FIGS. 1 and 2.

In order to illustrate the fact that the dual resonator 20 does, indeed, operate as the acoustic transformer, consideration will be given to the case wherein a signal generator is connected to the input circuit between terminals 29 and 25. The alternating electrical signal produced by the signal generator will excite the crystal between electrodes 26 and 24 causing it to oscillate at the excited frequency, generating a sonic wave which is coupled across the gap 28 to appear as a charge on electrode 27. At frequencies below resonance, the resonator will appear as a relatively large impedance, with correspondingly little effect in the output circuit. As frequency is increased, the symmetric mode is first encountered being a point of series resonance where attenuation is at a minimum. Turning to FIG. 4, which is a plot of amplitude (in solid lines) and phase shift (in dot-dash lines) versus frequency, the symmetric mode frequency is illustrated as $f_1$, and is shown to be a point of minimum attenuation, characterized by a phase shift of 180°. As frequency is further increased, attenuation again rises, then decreases to another minimum at the anti-symmetric frequency $f_2$, a similar point of minimum attenuation, but characterized by a phase shift of 0°. It is seen that both at the symmetric and anti-symmetric mode frequencies, the rate of change of phase with respect to frequency is very high, indicating that an oscillator using such a resonator will exhibit excellent frequency stability.

Also illustrated on the plot of FIG. 4 is the center frequency of the crystal $f_0$, that being the normal resonant frequency of the crystal. Because the lower electrode is split forming separate input and output circuits, such circuits being coupled across the gap 28, the coupling causes the input circuit to reflect an impedance into the output circuit and vice-versa, causing the production of two resonance points $f_1$ and $f_2$ shifted to either side of $f_0$. It is emphasized that series resonance is achieved at both of these frequencies, and as illustrated in FIG. 4, the resonant circuits are of high Q. The frequency difference between the symmetric and anti-symmetric responses is a function of coupling coefficient, and thus may be adjusted by appropriately configuring the gap 28 and the electrodes 26, 27.

In accordance with the invention, the dual monolithic resonator as described above is interconnected with one or more logic gates for providing amplification and feedback of appropriate phase to cause the circuit to oscillate at either the symmetric or anti-symmetric mode frequency of the crystal. If operation at the symmetric mode frequency is desired, the logic gate must be of the inverting variety, providing 180° of phase shift, cooperating with the 180° shift across the resonator so that the total loop shift is 360°. More generally, to operate at the symmetric mode frequency, the gate must provide $n$ pi radians of phase shift wherein $n$ is any odd integer. Alternatively, if operation is desired at the anti-symmetric mode frequency, then the logic gate must provide a phase shift of zero degrees, or more generally of $n$ pi radians where $n$ is any even integer, including zero.

Figure 5:
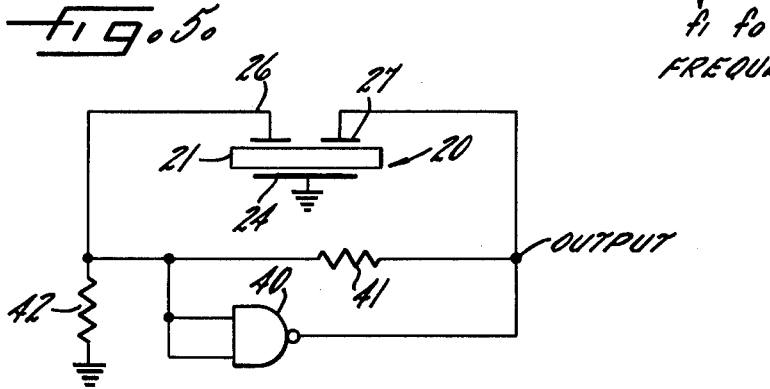
FIG. 5 is a schematic diagram showing a monolithic crystal controlled oscillator according to the present invention.

FIG. 5 illustrates a symmetric mode crystal controlled oscillator in accordance with the present invention, and graphically demonstrates the simplicity of the circuit achieved thereby. The monolithic resonator 20, as described above, has split electrodes 26, 27 cooperating with reference electrode 24, the split and reference electrodes being positioned on opposite sides of the quartz crystal blank 21. The reference electrode 24 is connected to circuit common as illustrated by the ground symbol. In this case, electrode 26 serves as the output electrode, being connected to the input of an inverting logic gate, shown herein as NAND gate 40. The output of the NAND gate, in turn, drives the electrode 27 which, in this case, may be considered the input electrode of the resonator.

To enhance the starting ability of the oscillator circuit, a pair of resistors 41, 42 are provided, resistor 41 being connected in parallel with the gate from the input to the output thereof, and resistor 42 being connected from the input of the gate to circuit common. The values of resistors 41 and 42 are chosen to bias the gate 40 in its linear region when power is first applied to the circuit, so that it is inherently unstable and begins to oscillate. Energy within the bandwidth of the resonator 20 will be fed back through the resonator, causing oscillation to build up at the symmetric mode frequency. Ultimately, the switching thresholds of the gate 40 will be reached whereupon the output of the gate will switch sharply between its low and high output states at the symmetric mode frequency. Because of the low impedance looking into the respective signal electrodes, the resistors 41, 42 will have little effect on operation once oscillation commences. As a result, the resonator maintains the high Q in the respective series resonant circuits, providing excellent frequency stability.

Referring to FIG. 6, there is shown an electrical equivalent circuit of the oscillator of FIG. 5, illustrating a further important factor in the structure of the logic gate 40. More specifically, in order to maintain the high Q response of the circuit, the input and output impedances of the gate 40 must be minimized because the response Q's decrease as the source and load resistance increases. The equivalent circuit of the gate 40 includes Thevenin generator 44 connected in series with the equivalent output impedance 45. Because the impedance 45 is in series with the input series resonant circuit, increasing the value of the resistor 45 will increase the attenuation at resonance or, in effect, de-Q that circuit. Similarly, the input impedance of the gate, illustrated as resistance 46, is in the path of current flow in the output resonant circuit. Again, increasing this resistance will increase the attenuation at resonance and thereby de-Q the circuit. Because high frequency stability requires maintenance of the high Q of the crystal, it is important to utilize logic gates in the instant circuit having very low input and output impedances.

Since the majority of logic gates are non-linear devices, it becomes rather difficult to specify an acceptable impedance level as a fixed value. However, the characteristics of the various gate types available provide a framework for characterization of a logic gate of the required configuration. Turning briefly to FIG. 9 there is shown the structure of a Schottky clamped TTL logic gate, which is the preferred type of gate used in practicing the instant invention. The illustrated gate is similar, circuit-wise, to the conventional TTL logic gate, with the exception of the addition of Schottky barrier diodes from base to collector on the transistors indicated, keeping those transistors from entering classic saturated conduction. The illustrated gate is a two input NAND logic gate, a member of the commercially available 7400 series, and identified as 74S00. While the overall operation of the gate will be apparent to one skilled in the art, attention will be directed to the input and output structures. Referring first to the output structure, it is seen to be a "totem pole" configuration wherein conductive transistors in the output structure provide both high and low output states. A Schottky clamped transistor 70 produces the low output state, and when caused to conduct by the phase splitter transistor 71 provides a very low impedance path to ground. The high output state, also controlled by a phase splitter transistor 71 occurs with transistor 70 cut off and Darlington configuration 72 conducting. It is seen that the Darlington 72 is formed of Schottky clamped transistor 73 and transistor 74, resistor 75 interposed between the positive supply and the Darlington providing a slight amount of current limiting. With the active pullup structure, as it is called, the logic gate is provided with a very low driving point impedance in the high output state, which complements the low output impedance in the low state provided by transistor 70. We have found that this low driving point impedance at both high and low output states is very important in maintaining the stability of the crystal oscillator because such low driving point impedances avoid any substantial degradation of the Q of the resonator. If discrete inverters or other logic gates not having conductive transistors for both output states are used, such as, for example, the open collector or passive pullup type of gate, the driving point impedance in at least one of the states becomes unacceptable.

Turning to the input structure of the Schottky clamped gate shown in FIG. 9, that structure comprises a multi-emitter transistor 77 whose emitters form the gate inputs. As the gate is used as a simple inverter, it will be apparent that the multiple emitters are not necessary. In order to impose a low input on the gate illustrated in FIG. 9, it is necessary to bring the input below the switching threshold, at which time current flows through resistor 78 and the base emitter structure of transistor 77 to the connected circuitry. Generally it is necessary for the connected circuitry to sink about 1.6 milliamps at a voltage below about a half volt. The low input impedance will be apparent. In the high input state the emitter-base junction of transistor 77 is reverse biased and the collector-base junction is forward biased, causing the emitter to act like a collector and the collector like an emitter. Current flow is thus from the input through the pseudo-collector-emitter circuit, through the base emitter circuit of transistor 71, and then split in the output structure between the base emitter of transistor 70 and the current drain indicated generally at 78. While the impedance in the high input state is somewhat higher than those discussed previously, it does not seriously degrade oscillator performance and, in combination with the other very low impedances provides a very stable oscillator circuit. In summary, viewing the impedance characteristics of the gate as a whole, at the switching points and operating levels of interest, the impedances of the gate can be generally characterized as less than a few hundred ohms. Using the Schottky clamped device illustrated in FIG. 9, propagation delays on the order of 4 nanoseconds are common, with a worst case propagation delay in the range between 6 to 8 nanoseconds. This very fast switching speed further enhances frequency stability. It is also possible, with some degradation of performance to use ordinary TTL logic gates in an oscillator according to the present invention, with the understanding that the logic gate referred to is of the type having an active pullup output structure. The structure of the conventional TTL logic gate is very similar to that shown in FIG. 9 except that the transistors 70, 71, 73, 77 and 78 do not have Schottky barrier diode clamps from base to collector. In other words, one form of TTL logic gate would be identical in all respects with the circuit of FIG. 9 except that transistors 70, 71, 73, 77 and 78 would be conventional, and symbolized as transistor 74. Because the conventional TTL gate has conductive transistors in the output structure to provide both high and low states, and a conductive transistor in the input structure for both high and low input states, that circuit is usable with a dual resonator according to the present invention and does not substantially degrade the Q of the resonator. However with conventional TTL gates the propagation delays are typically on the order of 8 to 12 nanoseconds and may become as high as 22 nanoseconds.

One characteristic of the illustrated circuit is the relatively precise duty cycle maintained thereby. More specifically, after the circuit begins to oscillate, the gate 40 is switching between its two stable logic levels at the frequency determined by the crystal. Because the switching times are very fast, and the propagation delays minimal, both the rise and the fall will be rather precisely timed, resulting in an output signal in the form of a square wave at a 50% duty cycle. A number of circuits were tested and showed an ability to maintain the 50% duty cycle with a deviation of less than ±5% over the temperature range of zero to 80° C. Some degradation was noted when the temperature range was extended between minus 55° and 80° C., but the duty cycle was still within ±7.5% of 50%.

Turning briefly to FIG. 7, there is shown a dual monolithic integrated circuit oscillator for operation at the anti-symmetric mode frequency. A monolithic dual resonator as described above is provided, having its reference electrode 24 connected to circuit common, its output electrode 26 connected to the input of an inverting logic gate, shown as NAND gate 50, and its input electrode 27 connected to the output of a second NAND gate 51. The output of NAND gate 50 is connected through a DC blocking capacitor 52 to the input of NAND gate 51. Capacitor 52 has a very small capacitive reactance so as to introduce minimal phase shift, coupling transitions at the output of gate 50 to the input of gate 51. Resistors 53, 54 are connected in parallel with the gates 50, 51, respectively, and resistor 42 is connected as described above to provide starting ability. In short, the gates 50, 51 provide drive between the input and output electrode of the crystal with 0° phase shift, causing the crystal to oscillate in the anti-symmetric mode, producing an output signal, which may be taken for example at the output of the NAND gate 51, in the form of a square wave of approximately 50% duty cycle at the anti-symmetric mode frequency.

As illustrated in FIG. 8, the two mode operation of the dual monolithic resonator provides a further advantage in that an oscillator may be constructed having two precisely determined crystal controlled operating frequencies, selectable by, for example, switch means 56. It is seen that the circuit of FIG. 8 is basically that shown in FIG. 7 with the addition of switch 56 coupled between the electrode 27 of the resonator and, in a first position, the output of NAND gate 50, and in a second position, the output of NAND gate 51. Thus, when the switch is in the first position, 180° of feedback will be provided around the resonator, causing operation in the symmetric mode. By way of contrast, when the switch 56 is in its second position, 360° of phase shift are provided, causing the circuit to operate at the anti-symmetric mode frequency. While the switch means 56 is schematically illustrated as a mechanical switch, it is apparent that electronic switching is also encompassed.

Referring again to the FIG. 5 embodiment, which is preferred for its simplicity, it is seen that the circuit is comprised of only four elements, namely the NAND gate, the resonator, and two resistors. Capacitors, inductors, and the like associated with many prior art oscillators are avoided and, as a result, the circuit is efficiently manufacturable in hybrid form, and may be incorporated into a single package. More specifically, a relatively small alumina substrate may be used as a base for the entire circuit, the resistors 41, 42 being thick film resistors painted onto the substrate, the gate 40 being a commercially available integrated circuit die, affixed to the substrate with the connections thereof bonded to appropriate foils on the substrate, and the resonator 20 simply mounted from three terminals carried by the substrate. The entire circuit has been manufactured in a package occupying approximately 13/16 inch by ½inch of board space, and standing only about 3/16 inch above the board. The package includes a single capacitor, used as a buffer across the power supply which, of course, need not be critically selected. Thus, in accordance with the invention, a square wave clock oscillator has been provided, occupying approximately the same amount of space as a typical dual in line package, being of simple construction, relatively inexpensive, and having improved operating characteristics over prior art clock oscillators.

We claim as our invention:

1. A square wave crystal controlled oscillator comprising a quartz crystal monolithic dual resonator having a pair of signal electrodes and a reference electrode cooperating therewith, integrated circuit logic gate means having an input coupled to one of said signal electrodes and an output coupled to the other of said signal electrodes, said resonator operating as an acoustic transformer wherein said electrodes form high Q series resonant input and output circuits acoustically coupled to resonate in symmetric and anti-symmetric modes at related frequencies, said logic gate means introducing a phase shift between said signal electrodes to cause said resonator to oscillate in a predetermined one of said modes and being of the type having a transistor input structure and a transistor output structure wherein conductive transistors in the output structure produce both high and low output states, thereby to provide low impedance drive to the resonator so as to avoid any substantial degradation of the Q of said resonator.

2. A crystal controlled square wave oscillator comprising a quartz crystal having opposed major faces with a pair of signal electrodes on one of said major faces and a reference electrode cooperating with said signal electrodes on the other major face, said quartz crystal acoustically coupling said signal electrodes so that said signal electrodes with respect to said reference electrode appear as respective high Q series resonant circuits coupled to produce symmetric and anti-symmetric resonance points, logic gate means having an input coupled to one signal electrode and an output coupled to the other signal electrode, said logic gate means being of the type having a transistor input structure and a transistor output structure wherein conductive transistors in the output structure produce both high and low output states to provide low impedance drive to the resonator so as to avoid any substantial degradation of the Q of said series resonant circuits, said logic gate introducing a phase shift of $n$ pi radians between said signal electrodes wherein $n$ is any integer including zero, so as to drive said resonator for oscillation at said symmetric or said anti-symmetric resonance points in one of said modes.

3. The crystal controlled oscillator as set forth in claim 2 further including resistance means connected to said logic gate means for biasing said logic gate means in the linear operating region thereof when power is first applied to said logic gate means, thereby to initiate oscillation in said crystal controlled oscillator.

4. The crystal controlled oscillator as set forth in claim 3 wherein said resistance means includes a resistor coupled between the input and output of said logic gate means, the resistor having a value substantially greater than the impedance of said resonator at resonance so that said resistor has no substantial effect of said resonator after oscillation is initiated.

5. The crystal controlled oscillator as set forth in claim 2 wherein said logic gate means is an inverting logic gate, whereby $n$ is any odd integer for causing said resonator to operate in the symmetric mode.

6. The crystal controlled oscillator as set forth in claim 5 wherein said logic gate means comprises a Schottky clamped TTL inverting logic gate.

7. The crystal controlled oscillator as set forth in claim 5 wherein said logic gate means is a Schottky clamped logic gate having respective high and low output voltage levels and being capable of switching between said levels with a propagation delay of less than 8 nsec, whereby after start-up said oscillator operates between said levels at substantially of 50% duty cycle.

8. The crystal controlled oscillator as set forth in claim 2 wherein said logic gate means is non-inverting from the input to the output thereof, whereby n is any even integer including 0 for causing said resonator to operate in said anti-symmetric mode.

9. The crystal controlled oscillator as set forth in claim 8 wherein said logic gate means comprises Schottky clamped TTL logic gates.

10. The crystal controlled oscillator as set forth in claim 8 wherein said logic gate means comprises Schottky clamped TTL logic gates having respective high and low output voltage levels and being capable of switching between said levels with a propagation delay of less than 8 nsec, whereby after start-up said oscillator operates between said levels at substantially a 50% duty cycle.

11. A crystal controlled square wave oscillator comprising a quartz monolithic dual resonator having first and second signal electrodes and a reference electrode cooperating therewith, said resonator having an anti-symmetric vibration mode wherein said crystal oscillates in the thickness-shear mode with said signal electrodes 180° out of phase, an inverting logic gate having an input coupled to said first signal electrode and an output coupled to said second signal electrode so as to introduce a 180° phase shift between said signal electrodes, said reference electrode being connected to a common junction, a first resistor connected in parallel with said logic gate and a second resistor connected between the input of said logic gate and said common junction, so that said first and second resistors bias said logic gate in the linear operating region thereof when power is first applied to said logic gate to initiate oscillation in said circuit, said logic gate having respective high and low output voltage levels when operating in a switching mode, said resonator providing a low impedance feedback path at the anti-symmetric mode frequency thereof to cause said logic gate to switch between high and low levels at the anti-symmetric mode frequency, thereby to produce a square wave output of substantially 50% duty cycle.

12. A dual frequency crystal controlled square wave oscillator comprising a quartz crystal monolithic dual resonator having first and second signal electrodes and a reference electrode cooperating therewith, said resonator having a symmetric and an anti-symmetric oscillation mode, said symmetric oscillation mode being characterized by a 180° phase shift across said resonator, said anti-symmetric oscillation mode being characterized by a 0° phase shift across said resonator, logic gate means coupled between the signal electrodes of said resonator, and switch means associated with said logic gate means and having a first state for causing said resonator to operate in the symmetric mode, and a second state for causing said resonator to operate in said anti-symmetric mode, whereby said oscillator may be controlled to operate at respective symmetric or anti-symmetric mode frequencies.

13. The crystal controlled oscillator as set forth in claim 12 wherein the logic gate means includes first and second inverting logic gates, the input of said first gate being coupled to the first signal electrode, the output of said first logic gate being coupled to the input of said second logic gate, said switch means being interposed between said second signal electrode and said logic gate means for selectively coupling the output of said first and said second logic gates to said second signal electrode.

14. The crystal controlled oscillator as set forth in claim 12 wherein said logic gate means includes a pair of inverting logic gates serially connected, said switch means having a first position for connecting one of said logic gates between said signal electrodes, and a second position for connecting both of said serially connected logic gates between said signal electrodes, thereby to control the frequency of operation of said oscillator.

* * * * *